United States Patent [19]

Bonora et al.

[11] Patent Number: 5,740,845
[45] Date of Patent: Apr. 21, 1998

[54] SEALABLE, TRANSPORTABLE CONTAINER HAVING A BREATHER ASSEMBLY

[76] Inventors: Anthony C. Bonora, 300 Felton Dr., Menlo Park, Calif. 94025; Frederick T. Rosenquist, 738 Canyon Rd., Redwood City, Calif. 94062; Sudhir Jain, P.O. Box 360156, Milpitas, Calif. 94538; Mark R. Davis, 750 N. Shoreline Blvd., Apt. 158, Mountain View, Calif. 94043

[21] Appl. No.: 499,588

[22] Filed: Jul. 7, 1995

[51] Int. Cl.⁶ .................................................. B65D 85/30
[52] U.S. Cl. ............................ 141/292; 141/98; 206/710; 414/217
[58] Field of Search ............................ 141/98, 291, 292; 414/217, 287, 292, 411, 422, 935, 940; 206/454, 710; 220/203.06, 203.07, 231, 316

[56] References Cited

U.S. PATENT DOCUMENTS

| | | | |
|---|---|---|---|
| 2,944,699 | 7/1960 | Oetiker | 220/231 |
| 4,396,130 | 8/1983 | Robinson | 220/316 |
| 4,465,202 | 8/1984 | Stoves et al. | 220/203.06 |
| 4,579,244 | 4/1986 | Fukuta | 220/203.07 X |
| 4,724,874 | 2/1988 | Parikh et al. | 141/98 |
| 4,851,018 | 7/1989 | Lazzari et al. | 414/217 X |
| 4,924,923 | 5/1990 | Boehmer et al. | 141/312 |
| 4,977,936 | 12/1990 | Thompson et al. | 141/312 |
| 5,169,272 | 12/1992 | Bonora et al. | 414/217 |
| 5,217,053 | 6/1993 | Foster et al. | 141/98 |
| 5,255,783 | 10/1993 | Goodman et al. | |
| 5,295,522 | 3/1994 | DeAngelis et al. | |
| 5,370,257 | 12/1994 | Chameroy et al. | 220/316 |
| 5,433,574 | 7/1995 | Kawano et al. | 414/217 |
| 5,482,161 | 1/1996 | Williams et al. | 414/217 X |
| 5,575,081 | 11/1996 | Ludwig | 414/217 X |

*Primary Examiner*—J. Casimer Jacyna
*Attorney, Agent, or Firm*—Fliesler, Dubb, Meyer & Lovejoy

[57] ABSTRACT

A transportable, sealable container, for example a SMIF pod, including a box and box door. The box has a first sealing surface and the box door has a second sealing surface. The two sealing surfaces form a seal when the box door is moved in a sealing position with respect to the box. A latch mechanism is provided in the box door for holding the box door in the sealing position. The container further includes a breather assembly having an aperture, with a filter, that allows gas to flow between the interior of the container and an environment external to the container. A valve, which is actuated by the latch, opens and closes the aperture. When the latch unlocks the box door, the valve opens the aperture. When the door is locked, the valve closes the aperture.

34 Claims, 12 Drawing Sheets

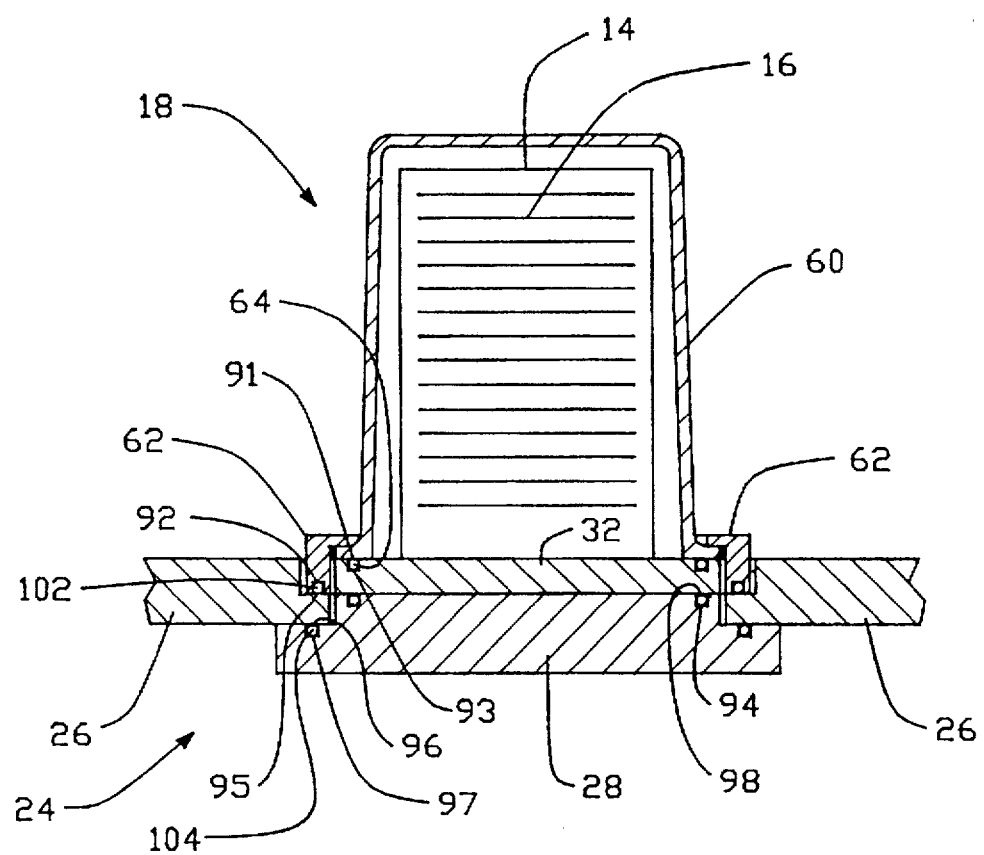
FIG.—4

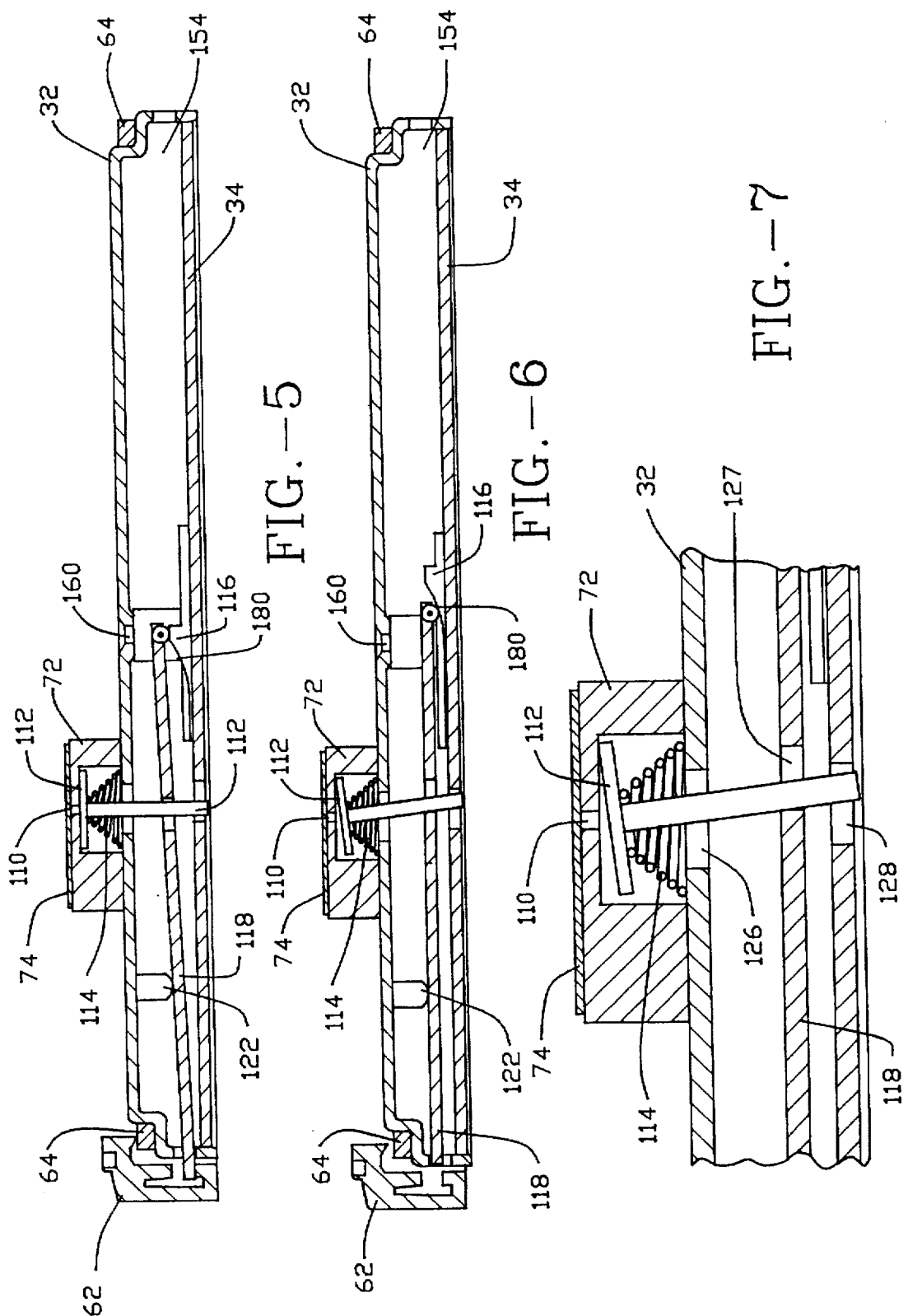

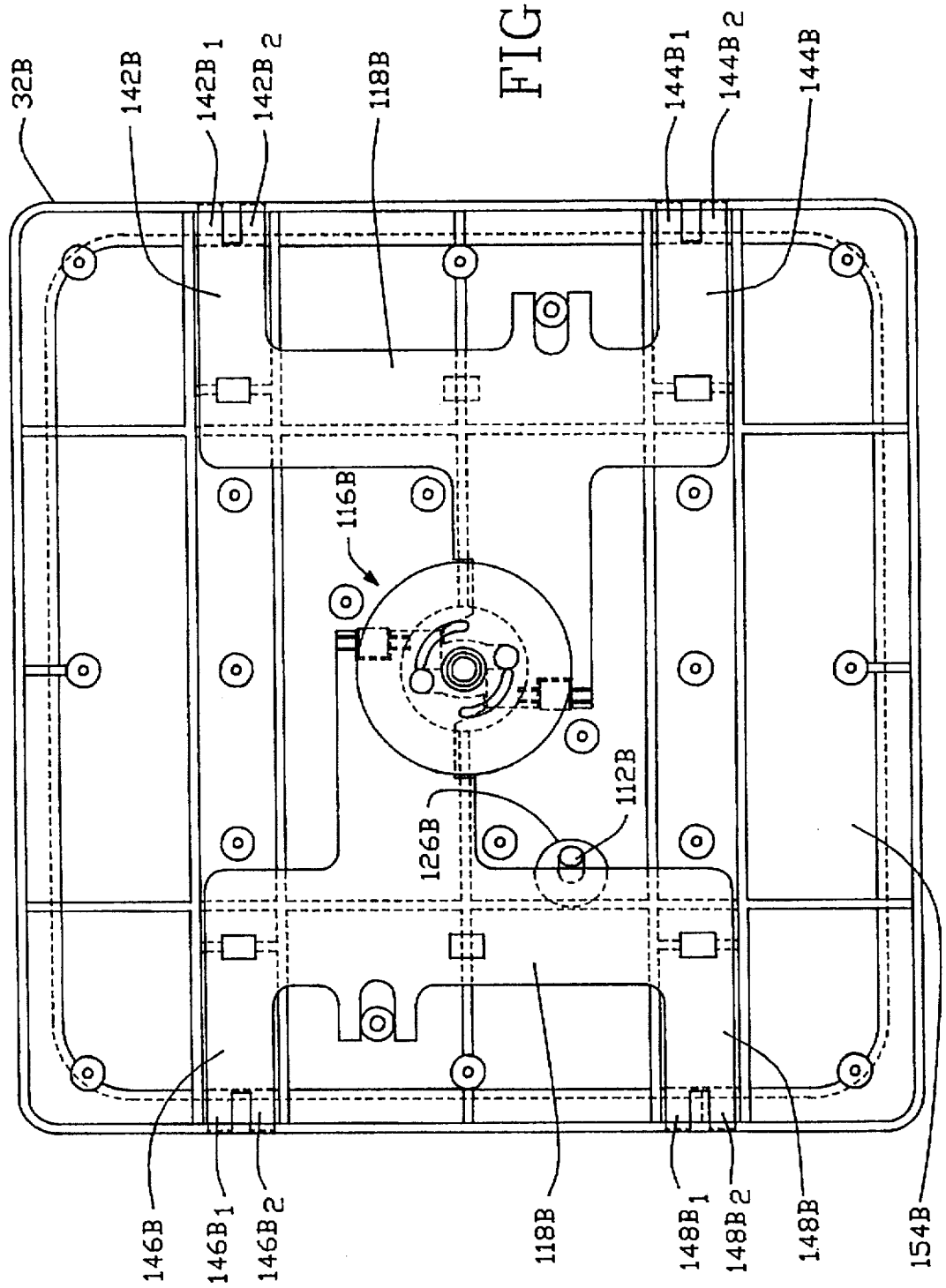

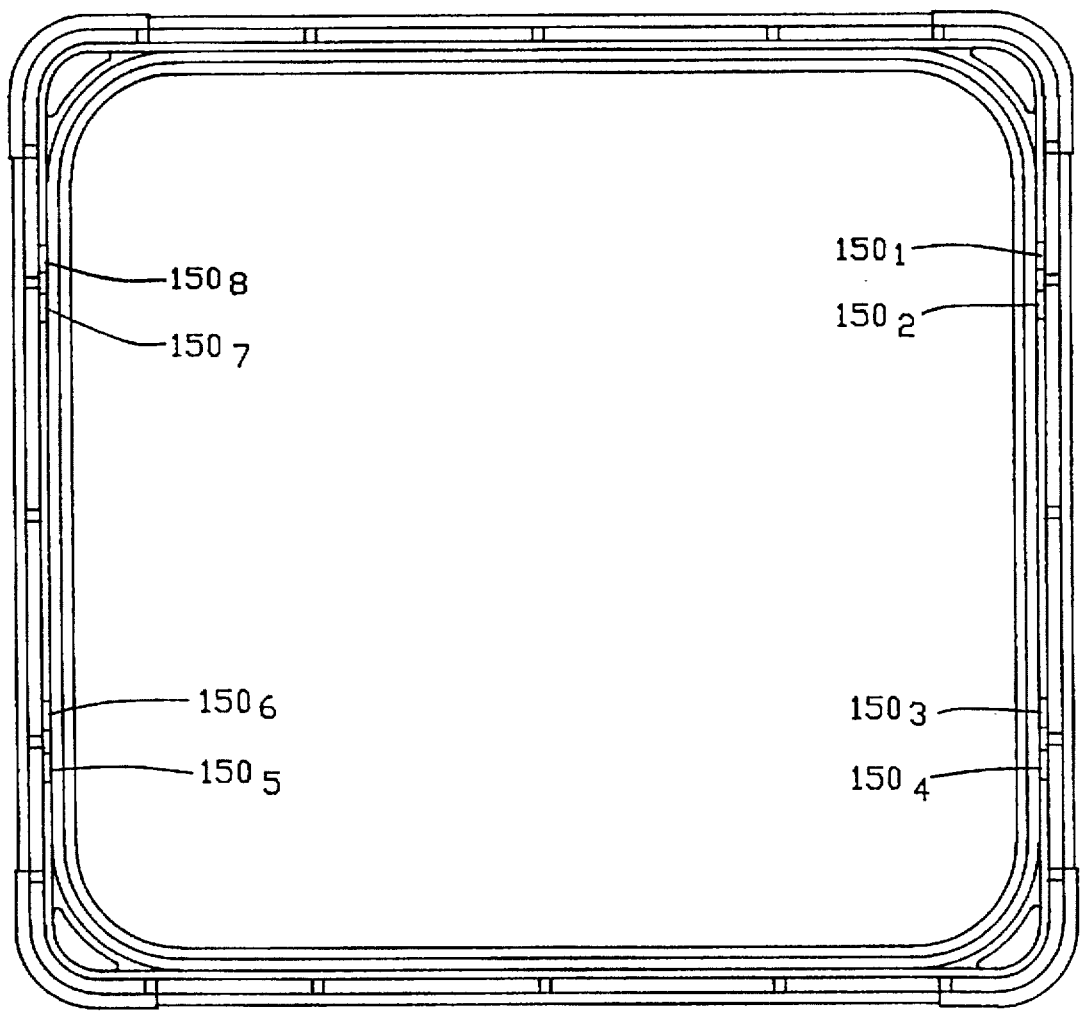
FIG.—14
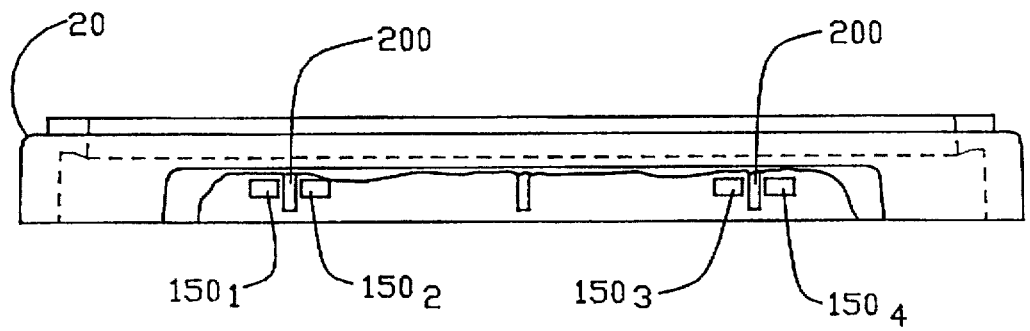
FIG.—15

SEALABLE, TRANSPORTABLE CONTAINER HAVING A BREATHER ASSEMBLY

CROSS-REFERENCE TO RELATED APPLICATIONS/PATENTS

This Application is related to the following Applications/Patents, all assigned to the assignee of the subject Application:

SEALED STANDARD INTERFACE APPARATUS, U.S. Pat. No. 4,674,939;

SEALABLE TRANSPORTABLE CONTAINER HAVING A PARTICLE FILTERING SYSTEM, U.S. Pat. No. 4,724,874;

CONTAINER HAVING DISPOSABLE LINERS, U.S. Pat. No. 4,739,882;

BOX DOOR ACTUATED RETAINER, U.S. Pat. No. 4,815,912;

SEALABLE TRANSPORTABLE CONTAINER HAVING IMPROVED LATCH MECHANISM, U.S. Pat. No. 4,995,430;

METHOD AND APPARATUS FOR TRANSFERRING ARTICLES BETWEEN TWO CONTROLLED ENVIRONMENTS, U.S. Pat. No. 5,169,272; and SEALABLE TRANSPORTABLE CONTAINER HAVING IMPROVED LINER, Ser. No. 07/865,297, filed Apr. 8, 1992.

Each of these Applications/Patents is incorporated herein by reference.

BACKGROUND OF THE INVENTION

1. Field of the Invention

The present invention relates to transportable containers for standardized mechanical interface systems for reducing particle contamination.

2. Description of the Related Art

A standardized mechanical interface (SMIF) system may be used to reduce particle fluxes onto wafers and/or reticles in semiconductor fabrication. This purpose is accomplished, in part, by mechanically ensuring that during transportation and storage the gaseous media (such as air or nitrogen) surrounding the wafers is essentially stationary relative to the wafers and by ensuring that particles from the ambient environment do not enter the immediate wafer environment. The SMIF concept is based on the use of a small volume of controlled (with respect to motion, gas flow direction and external contaminants), particle-free gas to provide a clean environment for articles.

A SMIF system has three main components: (1) sealed pods, having a minimal volume, used for storing and transporting cassettes holding reticles or wafers; (2) enclosures placed over cassette ports and wafer processing areas of processing stations so that the environments inside the pods and enclosures (having clean air sources) become miniature clean spaces; and (3) a transfer mechanism to load/unload wafer cassettes from a sealed pod without contamination of the wafers in the wafer cassette from external environments. The sealed pods typically include a box, a box door and a latch for holding the box door in a closed (or sealing) position with respect to the box. The enclosures typically include a port plate, a port door and a latch for holding the port door in a closed (or sealing) position with respect to the port plate. Instead of a latch, another mechanical apparatus can be used to hold the port door in the closed position.

Wafers are stored and transported in the pods, and are transferred from a pod to a processing station in the following manner. First, a pod is placed on the interface port on top of the enclosure. Then, latches release the box door and the enclosure's port door simultaneously. The box door and the port door are opened simultaneously so that particles which may have been on the external door surfaces are trapped ("sandwiched") between the box and interface port doors. A mechanical elevator lowers the two doors, with the cassette riding on top, into the enclosure covered space. A manipulator picks up the cassette and places it onto the cassette port/elevator or other receiving area of the processing station. After processing, the reverse operation takes place.

Processing stations with enclosures may have an interior region which is a controlled atmosphere; for example, controlled humidity (e.g., de-humidified), nitrogen, argon, or other appropriate gas. In situations where the processing station has a controlled atmosphere, it is desirable to prevent contamination of the controlled atmosphere in the processing station when loading articles from the SMIF pod to the processing station. One mechanism for preventing such contamination is to use a SMIF pod having a particle filtering system as disclosed in U.S. Pat. No. 4,724,874, and to control the environment in the interior region of the SMIF pod by the removal or introduction of appropriate gases into the SMIF pod. Thus, a clean room facility using a SMIF pod may wish to inject a gas for example, nitrogen, into the SMIF pod to create an inert environment.

In order to maintain the inert environment inside the SMIF pod, the seal between the box and box door of a SMIF pod has been improved to reduce leakage of the gas from inside the SMIF pod. As seal technology improves, the insertion of gas into the pod will require strict monitoring of the pressure inside the pod in order to ensure that the pressure inside the pod is the same as the pressure of the interior region of the processing station. A small difference in pressure between the interior region of the SMIF pod and the interior region of the processing station can create a vacuum which holds the SMIF pod box door closed after the latch has been released and the elevator assembly has lowered. In such a case, the elevator would lower the port door, and the pod door would remain closed preventing access to the interior of the pod.

Additionally, during shipping, a SMIF pod could be placed in the cargo area of an airplane. When the airplane is at an altitude, there can be an extreme pressure change. This pressure change could damage the liner of the SMIF pod or force air to leave or enter the SMIF pod through a seal, possibly damaging that seal.

One solution to these problems is to modify a SMIF pod to add an aperture with a filter. However, a SMIF pod with only an aperture and filter would not be able to maintain an inert environment isolated from the environment external to the SMIF pod. Another solution which includes actively injecting and removing gas through an outlet in the SMIF pod in order to maintain a desired pressure and clean environment can be expensive and, a small difference in pressure between the interior of the SMIF pod and the exterior of the SMIF pod could cause the SMIF pod box door to stick to the SMIF pod box.

SUMMARY OF THE INVENTION

The present invention is directed to overcome the disadvantages of the prior art.

It is, therefore, an object of the present invention to provide a sealable, transportable container which can equalize the pressure inside the container to the pressure outside the container without opening the container.

Another object of the present invention is to provide a sealable, transportable container having a breather assembly which, upon mating with a SMIF port of a processing station, allows the pressure in the interior of the container to become equal to the pressure inside the port of the processing station.

Another object of the present invention is to provide a sealable, transportable container with a breather assembly that can be maintained in an open position during shipping of the container such that pressure changes outside the container will not damage the container.

Another object of the present invention is to provide a sealable transportable container capable of maintaining a controlled environment in the interior of the container such that when an attempt is made to open the door of the container, the door will not stick closed because of a vacuum effect within the container.

These and other objects of the present invention are provided by a sealable, transportable container (e.g. a SMIF pod) having a breather assembly. The container can be used as part of a SMIF system. The breather assembly has open and closed positions. Closing the breather assembly isolates the interior region of the container from ambient atmospheric conditions. Opening the breather assembly equalizes and/or regulates pressure inside the container, allowing the pressure inside the container to approach the pressure outside the container.

In one embodiment, a sealable, transportable container comprises a box having a first sealing surface and an interior region. The container further includes a box door having a second sealing surface so that the first sealing surface and the second sealing surface form a first seal when the box door is moved to a sealing position with respect to the box. The box door has an aperture and a valve for opening and closing the aperture. Connected to the valve is an actuator for moving the valve so that moving the actuator to a first position closes the aperture and moving the actuator to a second position opens the aperture.

The sealable, transportable container can further include a latch for holding the box door in the sealing position. The actuator can be connected to the latch or the actuator can be the latch. When the latch is in a locked position the box door is held in the sealing position, the valve is closed and the interior region is isolated from the environment external to the container. When the latch is in an unlocked position, the valve is open and gas can flow between the interior region of the container and the environment external to the container. In one embodiment, the latch includes a latch plate and a cam for moving the latch plate.

These and other objects and advantages of the invention will appear more clearly from the following description in which the preferred embodiments of the invention have been set forth in detail in conjunction with drawings.

BRIEF DESCRIPTION OF THE DRAWINGS

FIG. 4 is a sectional view of a SMIF pod and a port assembly for receiving the SMIF pod.

FIG. 5 is a sectional view of the box door showing the breather assembly and the latch mechanism in a locked position.

FIG. 6 is a sectional view of the box door showing the breather assembly and the latch mechanism in an unlocked position.

FIG. 7 is a blow-up sectional view of the breather assembly of FIG. 6.

FIGS. 8B and 9B are plan views of an alternative embodiment box door of a SMIF pod showing a latch mechanism and the bottom of the breather assembly in unlocked and locked positions, respectively.

FIG. 14 is a plan view of an interface portion of a SMIF pod box which interacts with the latch mechanism shown in FIGS. 8–9.

FIG. 15 is a partial cutaway side view of the interface portion shown in FIG. 14.

DESCRIPTION OF THE PREFERRED EMBODIMENT

The present invention will be described in the context of a system for storing and transporting semiconductor wafers and/or reticles. However, it is to be understood that a sealable, transportable container in accordance with the present invention may be used to store and transport many other inanimate objects such as magnetic recording disks, as well as living objects such as laboratory animals.

Figure 1A:
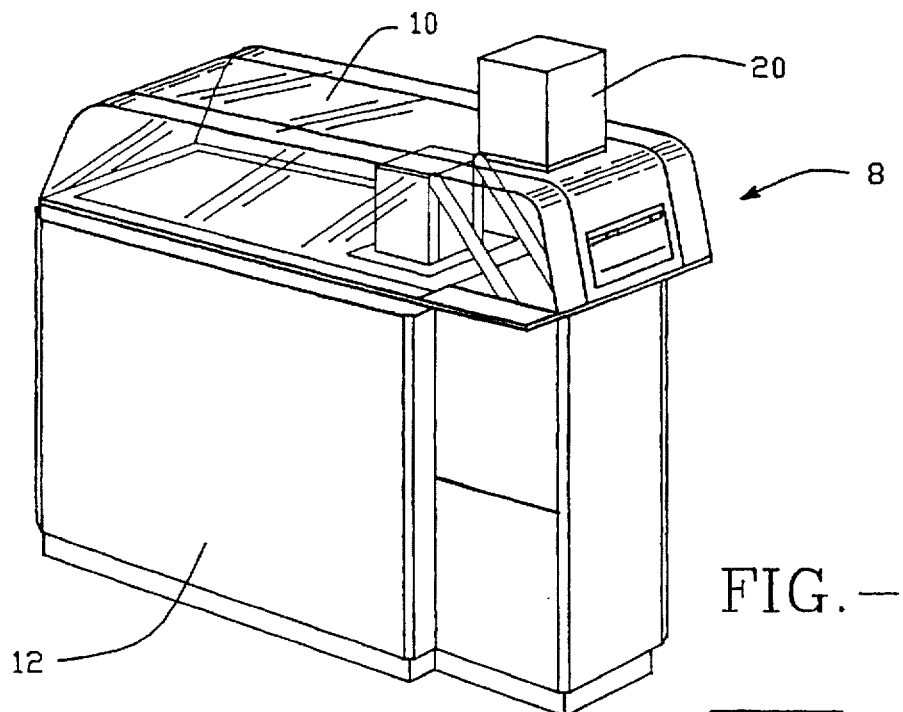
FIG. 1A is an isometric view of a processing station having a canopy for receiving a SMIF pod.
Figure 1B:
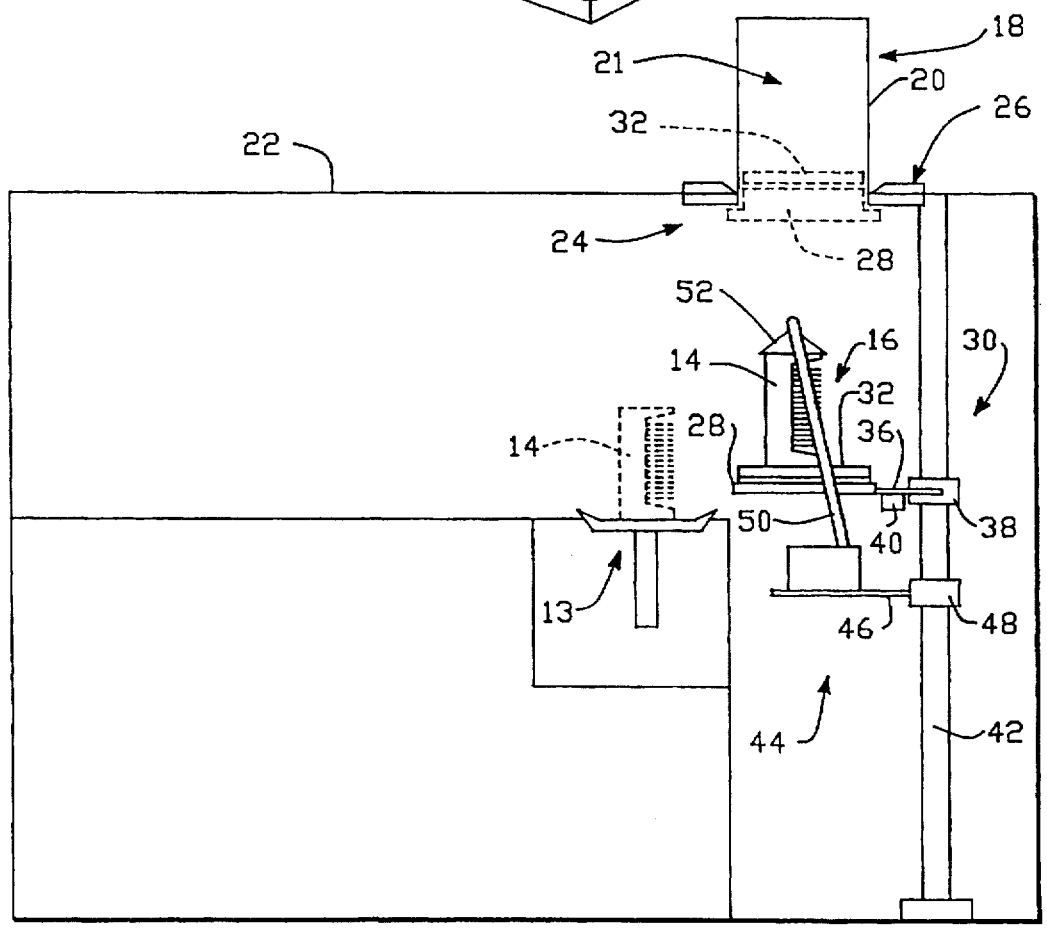
FIG. 1B is a cutaway side view of the processing station of FIG. 1A.

One example of a SMIF system is shown in FIGS. 1A and 1B, which illustrate a processing station 8 having a canopy 10 which is an easily removable shield that covers the wafer handling mechanism of processing equipment 12. Equipment 12 may be, for example, a photoresist applicator, mask aligner, inspection station or any similar processing equipment. Canopy 10, which is constructed of glass or transparent plastic such as acrylic or lexan to facilitate visual inspection and/or maintenance within canopy 10, encloses the handling mechanism for processing equipment 12 and a holder 14, such as a wafer cassette holding wafers 16. The environment within the processing station is separately maintained and separately cleaned; therefore, equipment 12 need not be installed in a clean room.

A sealable transportable pod (or container) 18 including a box 20 having interior region 21 and a box door 32 is mounted on horizontal surface 22 of a canopy 10 of a port assembly 24. Port assembly 24 includes a port plate 26, port door 28, and an elevator assembly 30. Elevator assembly 30 transports a cassette 14, containing integrated circuit wafers 16 from interior region 21 of a box 20 onto the region beneath canopy 10.

In FIG. 1B, port door 28 and box door 32 are shown in the closed position by the dotted lines. The elevator assembly 30 includes a platform 36, a shaft engagement device 38, and a drive motor 40. Platform 36 carries port door 28, box door 32 and cassette 14 in a vertical direction. Platform 36 is attached by engagement devices 38 to a vertical guide 42 of elevator assembly 30.

Typically, guide 42 includes a lead screw (not shown) and drive motor 40 drives a gear (not shown) which engages the lead screw for driving platform 36 up or down. When platform 36 is driven to the closed position, port door 28 closes the port opening in canopy 10.

In a similar manner, a manipulator assembly shown generally by numeral 44 includes a platform 46 which has an engagement means 48 for engaging vertical guide 42. Manipulator assembly 44 includes a manipulator arm 50 and engagement head 52 adapted to engage cassette 14. By vertical operation of platforms 36 and 46, and by operation of manipulator assembly 44, cassette 14 is moved from its position on box door 32 to a position on equipment station 13 (as shown by the broken lines).

Figure 2:
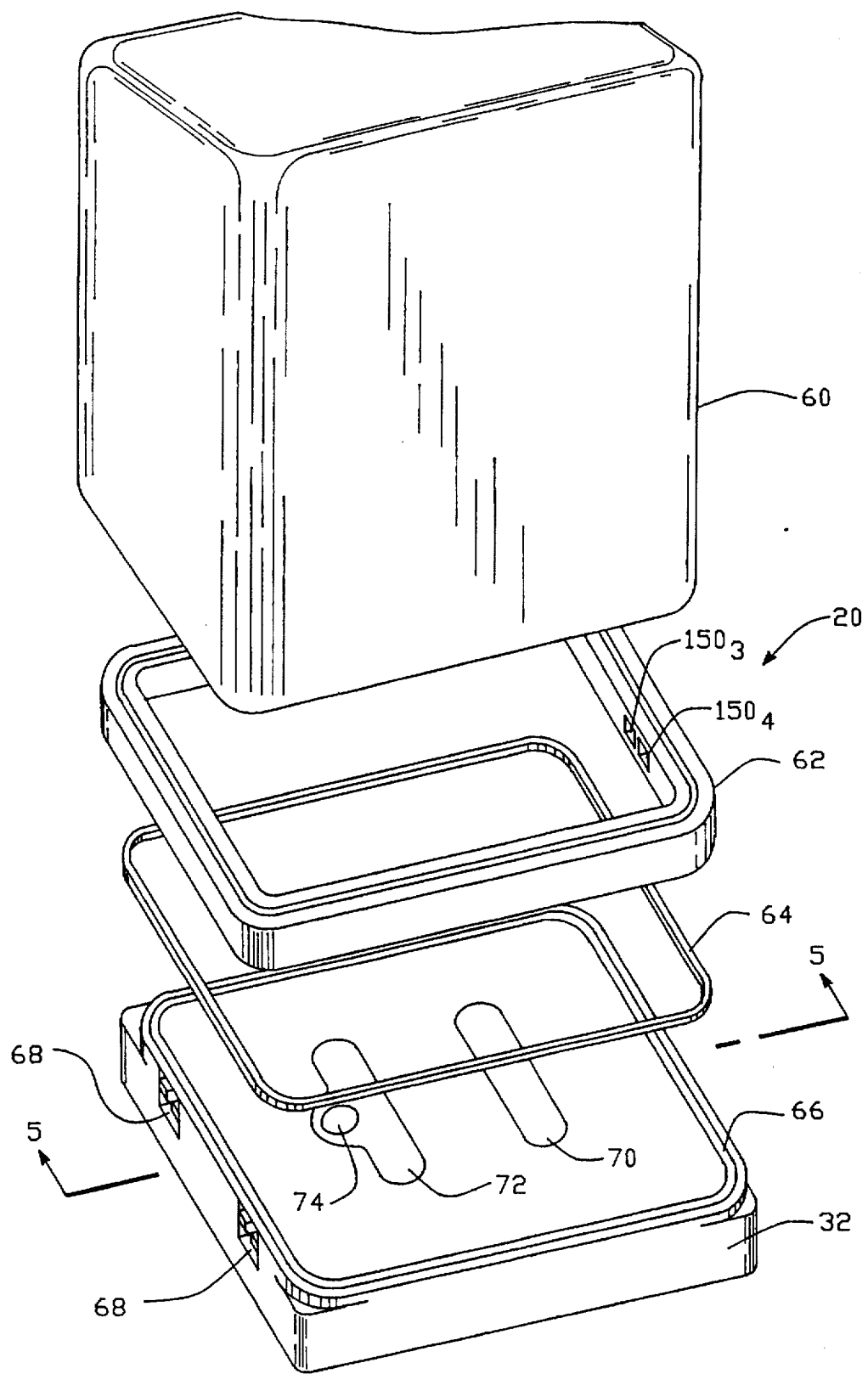
FIG. 2 is an exploded isometric view of a SMIF pod in accordance with the present invention.

With reference to FIG. 2, box 20 includes a domed housing 60 and a ring-like engaging portion 62. Housing 60 and engaging portion 62 may be formed integrally, for example, by injection molding, or as separate components assembled to form box 20. A gasket 64, which provides the seal between box 20 and box door 32 resides in a gasket-retaining slot 66 in box door 32. In the preferred embodiment, a liner (not shown) is provided on door 32 and gasket 64 contacts the liner. The liner is a removable element which may be formed of, for example, plastic materials which do not outgas or introduce particles, as described in U.S. Pat. No. 4,739,882, which is hereby incorporated by reference. The liner may also be formed of a material which provides the capability of dissipating or preventing the formation of static charges. A latch mechanism is housed in box door 32 and protrudes from box door 32 through windows 68 to engage latch engaging surfaces $150_{1-8}$ (FIGS. 2 and 14-15) of box 20. On the top surface of box door 32 are cassette guides 70 and 72, which are used to position cassette 14 (FIG. 1B) on box door 32. Shown on cassette guide 72 is filter 74 which, as described below, is part of the breather assembly. Filter 74 and the aperture it covers are not required to be located on a cassette guide.

Figure 3:
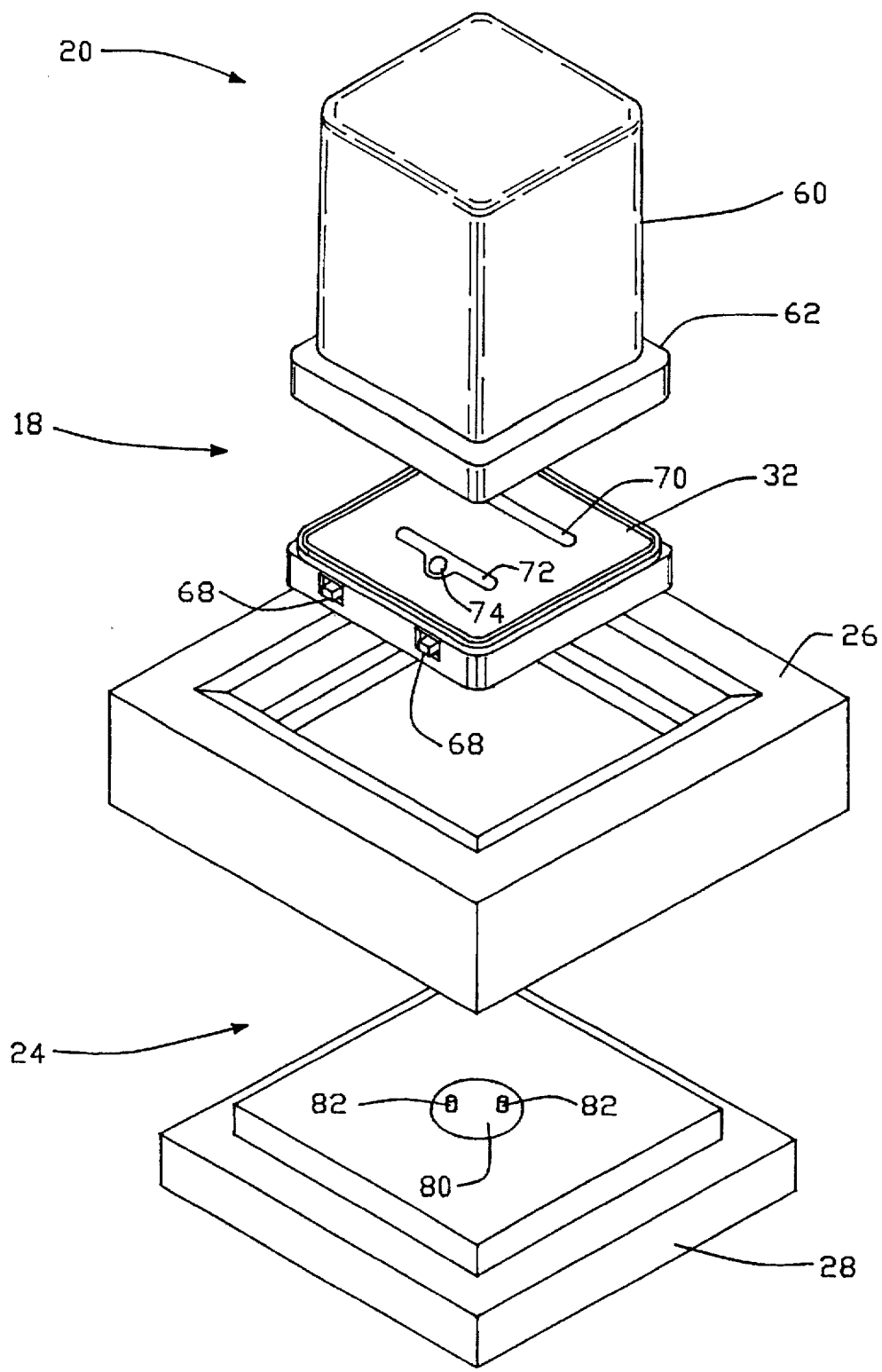
FIG. 3 is an exploded isometric view of a SMIF pod and portions of a port assembly for receiving the SMIF pod.

FIG. 3 is an exploded view of container 18 and port assembly 24. Port door 28 has an actuating mechanism 80 with pins 82. Pins 82 fit inside holes in a cam mechanism 116 (described below). Actuating mechanism 80 rotates, thus, actuating cam 116 which translates the motion to a latch (described below) and a valve in the breather assembly (described below). Such motion translated to the latch releases the box door 32 from box 20, allowing the wafers to be removed.

FIG. 4 shows container 18 mated to port assembly 24 of processing equipment 12. Container 18 is designed for sealably mating with the port assembly 24. Box 20 has first and second box top sealing surfaces 91 and 92, respectively. Box door 32 has a first box door sealing surface 93 for forming a first seal (sealably mating) with first box top sealing surface 91 when gasket 64 is compressed. Port plate 26 has first and second port plate sealing surfaces 95 and 96, respectively. First port plate sealing surface 95 sealably mates with second box top sealing surface 92, forming a second seal with gasket 102.

Port door 28 has a first port door sealing surface 97 which sealably mates with second port plate sealing surface 96 forming a third seal with gasket 104. Port door 28 has a second port door sealing surface 94 which sealably mates with second box door sealing surface 98 to form a fourth seal.

FIGS. 5-7 show the preferred embodiment breather assembly housed within box door 32. On top of cassette guide 72 is a filter 74 covering an aperture 110. Beneath aperture 110 is a valve 112 which serves to open and close aperture 110. Valve 112 is normally held in a closed position (FIG. 5) by springs 114. Springs 114 allow valve 112 to be pivoted so that aperture 110 can be opened (FIG. 6); however, when the pivoting force is removed from valve 112, springs 114 force valve 112 to close aperture 110. The force that opens valve 112 is provided by latch plate 118 (or other actuator) which is controlled by cam 116 (described below). When latch plate 118 is in the locked position (FIG. 5), latch plate 118 does not exert a force on valve 112. When latch plate 118 is in the unlocked position (FIG. 6), latch plate 118 pushes against valve 112 causing valve 112 to pivot.

During the normal operation of a SMIF system, a container is placed on a port. The port unlocks the latch which causes valve 112 to open aperture 110 and allow gas to flow between the interior region of the container 21 and the interior region of the port.

The pivoting of valve 112 opens aperture 110 such that when the pressure inside container 20 is greater than the pressure external to container 20 air passes from interior region 21 of container 18 through filter 74, through aperture 110, through box door upper aperture 126 (see FIG. 7), through latch plate aperture 127 (see FIG. 7), and through box door lower aperture 128. If the container is mated to a port, gas exiting lower aperture 128 would flow into the interior region of the port. Should the pressure in container 20 be less than the pressure outside box door 32, then air or other gases would travel in a path reverse to that described above. Various alternatives are available that route the air through other paths; for example, the air can circulate within box door 32 and exit out apertures in the side of box door 32, air can travel through a conduit or air can be channeled to an outlet in a manner similar to that described in U.S. Pat. No. 5,169,272, incorporated herein by reference. The discussion of the flow of gas also includes the flow of liquids.

Filter 74 can be used to prevent contaminants from entering container 20 or from leaving container 20. The preferred embodiment filter is a continuous membrane of expanded polytetrafluoroethylene (PTFE) laminated to a 100% polyester spun bonded non-woven backer. Alternative materials to PTFE are polypropylene (PP), cellulose acetate, cellulose nitrate, UHMW polyethylene, high density polyethylene (HDPE), low density polyethylene (LDPE), very low density polyethylene (VLDPE), polyvinylidene fluoride (PVDF), polysulfone (PSO), ethylene vinyl acetate (EVA), polystyrene (PS), PFA, and nylon 66. Alternatives for the backer are polyester, polycarbonate, polypropylene, acetate, acrylar, kimdura, polystyrene, primalyn UPHC, Tyvek, vinyl and aluminum foil. Alternatives for an adhesive are pressure sensitive acrylic adhesive no. 200, rubber or repositionable wet surface acrylic. Additionally, any other filters known in the art could be used or filters known in other arts can be used, for example, a high efficiency disk drive breather falter, syringe filter, gas filter, submicron filters with electropolished and welded 316SS housings, pleated media filters, cartridge filters, and in-line filters.

The preferred embodiment valve would be made of polycarbonate. The latch plate would preferably be made of aluminum. In the preferred embodiment, valve 112 would fit entirely within box door 32 (e.g., not stick out the bottom of box door 32) so that an operator is not likely to accidentally open valve 112. Furthermore, the breather assembly-latch mechanism is designed so that upon unlocking box door 32, the pressure in interior region 21 of box 20 is equalized very quickly to the pressure in the processing station so that box door 32 does not remain closed because of a vacuum effect.

In one alternative, it would be possible to fit a plug into box door aperture 128 to force valve 112 to remain in the opened position. This plug could have a hole in it so that while valve 112 is in an open position, air could flow between interior region 21 and an external environment. This embodiment could be used for containers shipped by airplane. Other alternatives include actuating the valve separately from the latch plate or separately from the latch, and even placing the breather assembly directly on box 20. Filter 74 could also be used as part of a liner. When the filter is used in conjunction with the liner, the filter could be part of the liner, the filter could be the liner, the filter could be below the liner or the filter could be above the liner. Alternatively, there can be a breather assembly with no filter. In yet another embodiment, the breather assembly can be manually operated, or automatically operated in some other fashion.

As stated above, cam 116 and latch plate 118 control movement of valve 112. FIGS. 8–15 further explain the cam and latch mechanisms. The two-stage rotary cam latch mechanism of the present invention (preferred embodiment depicted in FIGS. 8A and 9A) includes latch plates 118, a cam mechanism 116 pivotally mounted on box door 32, and latch plate supports $135_{1-6}$. The operation of latch mechanism is a two-stage operation. In the first stage of operation during locking, cam mechanism 116 routes causing latch plates 118 to slide linearly. In the second stage, cam mechanism 116 rotates causing latch plates 118 to pivot on latch plate supports $135_{1-6}$. The breather assembly of the present invention can be used with a one stage cam or other type of cam.

Each latch plate 118 has at least one box-engaging portion. In the preferred embodiment of the present invention, each of the two latch plates 118 has two latch arms 142,144 and 146,148, respectively. Each latch arm has two latch fingers $142_{1-2}$, $144_{1-2}$, $146_{1-2}$, and $148_{1-2}$ which engage respective ones of latch engaging surfaces $150_{1-8}$ of box 20 (see FIG. 14).

The first stage of the latching operation involves moving latch plates 118 from the retracted (or disengaged or unlocked) position (FIG. 8A) where latch plates 118 are entirely contained within box door 32 to the extended (or engaging or locked) position (FIG. 9A) where latch fingers $142_{1-2}$, $144_{1-2}$, $146_{1-2}$ and $148_{1-2}$ extend out of box door 32 and are adjacent to latch engaging surfaces $150_{1-8}$ of box 20. In the first stage when latch plates 118 move from the retracted position to the extended position in a plane parallel to the plane of box door 32, latch fingers do not contact latch engaging surfaces $150_{1-8}$. Accordingly, there are no particles created by scraping or rubbing of the latch fingers against latch engaging surfaces $150_{1-8}$.

The second stage of the latching operation involves substantially vertical motion of latch fingers $142_{1-2}$, $144_{1-2}$, $146_{1-2}$ and $148_{1-2}$. "Substantially vertical motion" refers to motion in a direction perpendicular to the plane of box door 32, and to the plane of motion of latch plates 118 during the first stage of the latching operation. The motion of latch fingers $142_{1-2}$, $144_{1-2}$, $146_{1-2}$ and $148_{1-2}$ during the second stage engages latch fingers $142_{1-2}$, $144_{1-2}$, $146_{1-2}$ and $148_{1-2}$ with respective ones of latch engaging surfaces $150_{1-8}$, and creates a latching and/or clamping force which sealably mates first sealing surface 91 of box 20 with second sealing surface 93 of box door 32.

Figure 8A:
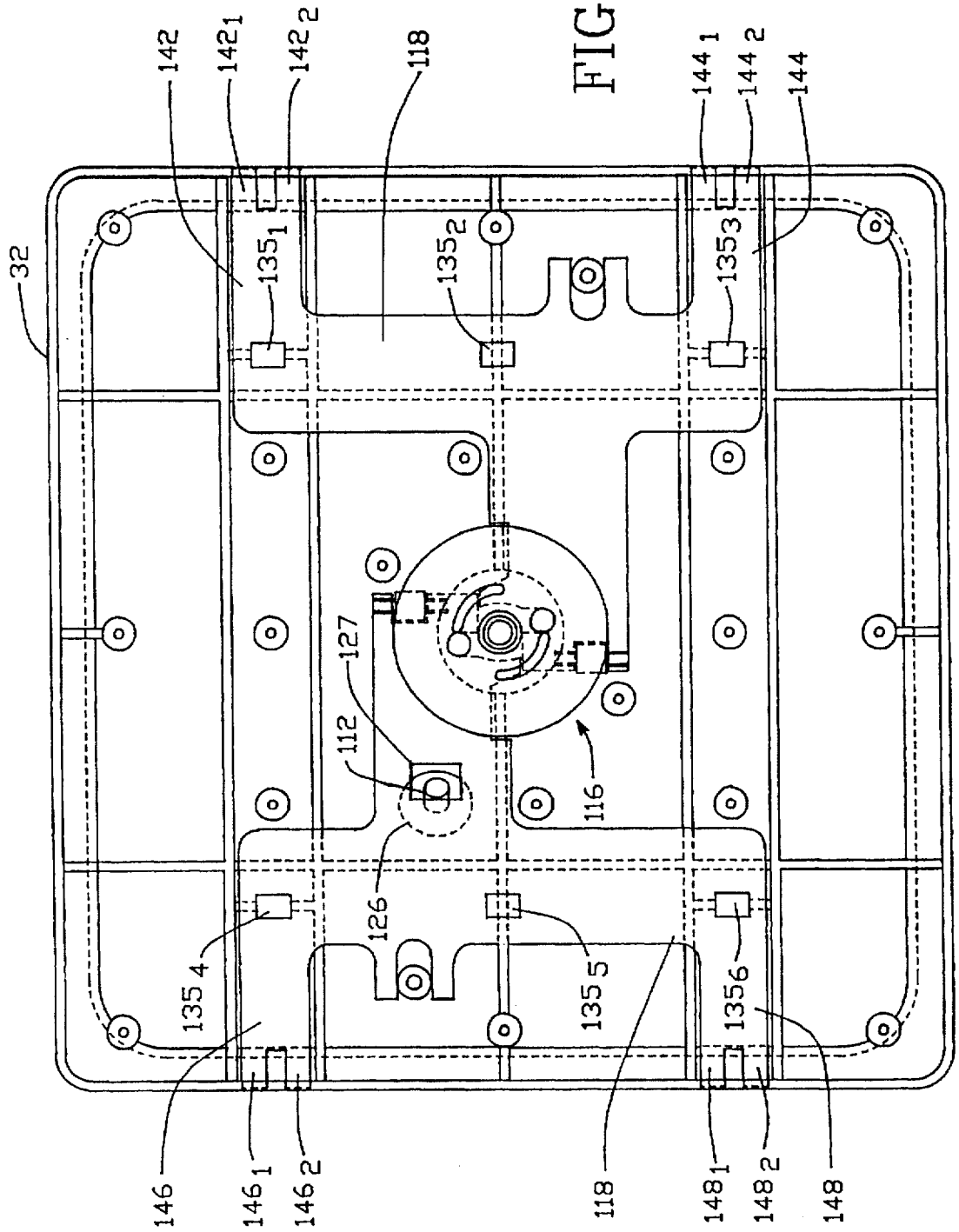
FIGS. 8A and 9A are plan views of a box door of a SMIF pod showing a latch mechanism and the bottom of the breather assembly in unlocked and locked positions, respectively.
Figure 9A:
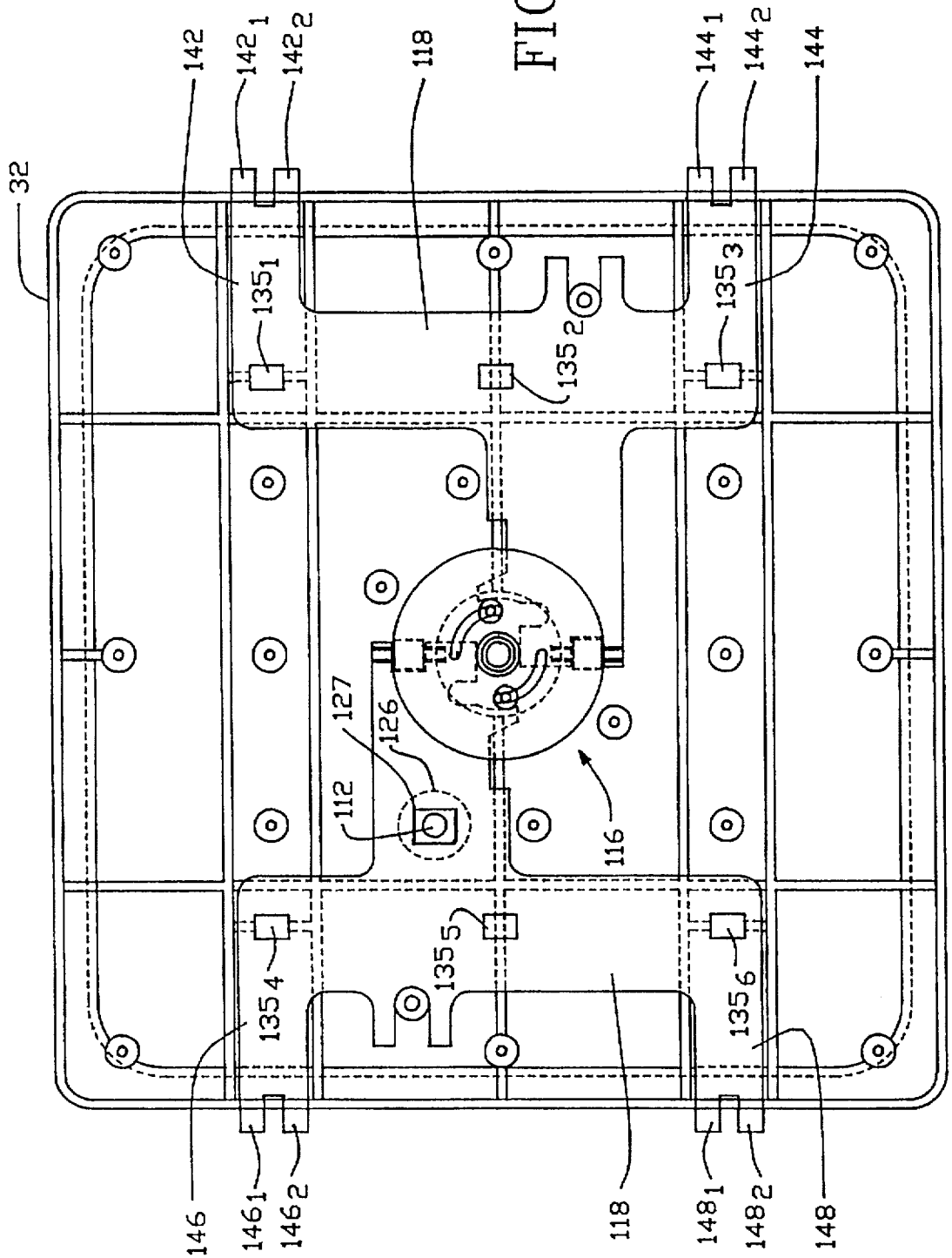

Looking at FIGS. 8A and 9A, the bottom of valve 112 and aperture 127 can be seen. When the latch mechanism is in the unlocked position (FIG. 8A) the latch plate 118, at the edge of aperture 127, is exerting a force on valve 112 causing valve 112 to pivot. Thus, the bottom of valve 112 appears on an angle. This situation is analogous to the drawing of FIG. 6.

When the latch mechanism is in the locked position (FIG. 9A), latch plates 118 are positioned such that the latch plates 118 are not providing any force on valve 112 and thus springs 114 hold valve 112 in a closed position. This situation is analogous to the drawing of FIG. 5.

Figure 9B:
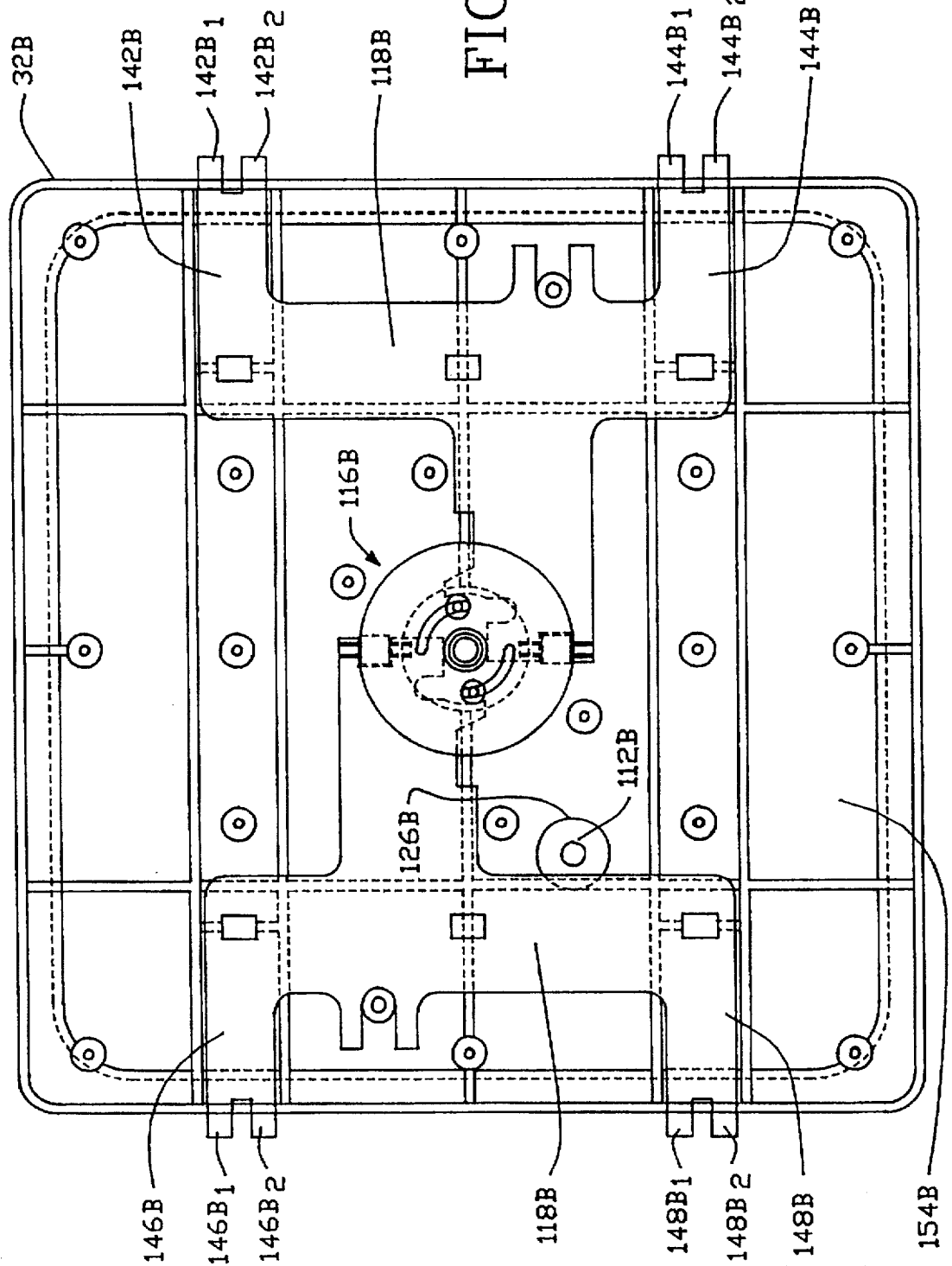

An alternative embodiment is shown in FIGS. 8B and 9B. Rather than have an aperture in latch plate 118B, the edge of latch plates 118B exerts a force on valve 112B. Thus, some of the gas may be deflected by the latch plate and thus circulate through cavity 154B. FIG. 8B shows the alternative embodiment in the unlocked position and, FIG. 9B shows the alternative embodiment in a locked position.

In operation, both embodiments work fairly similar. When the latch plates are in an unlocked position a force is exerted on valve 112, opening aperture 110. When the latch plates are in a locked position, the latch does not exert a force on valve 112, and aperture 110 is closed.

Figure 11:
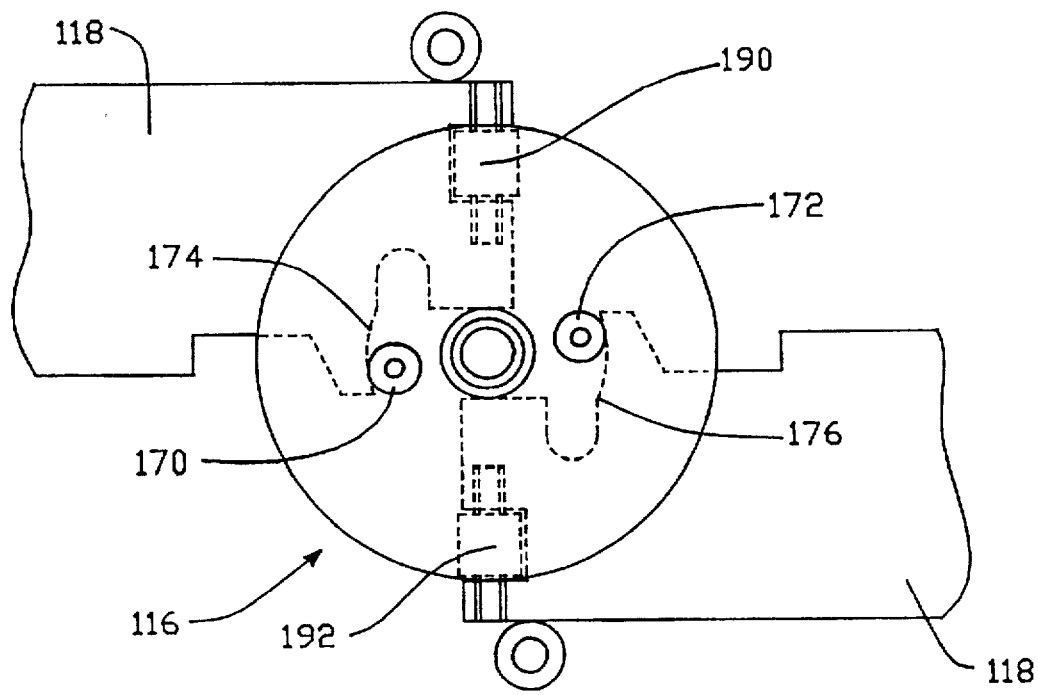
FIGS. 10 and 11 are plan views of a two-stage rotary cam of the latch mechanism used to actuate the valve in unlocked and locked positions, respectively.
Figure 10:
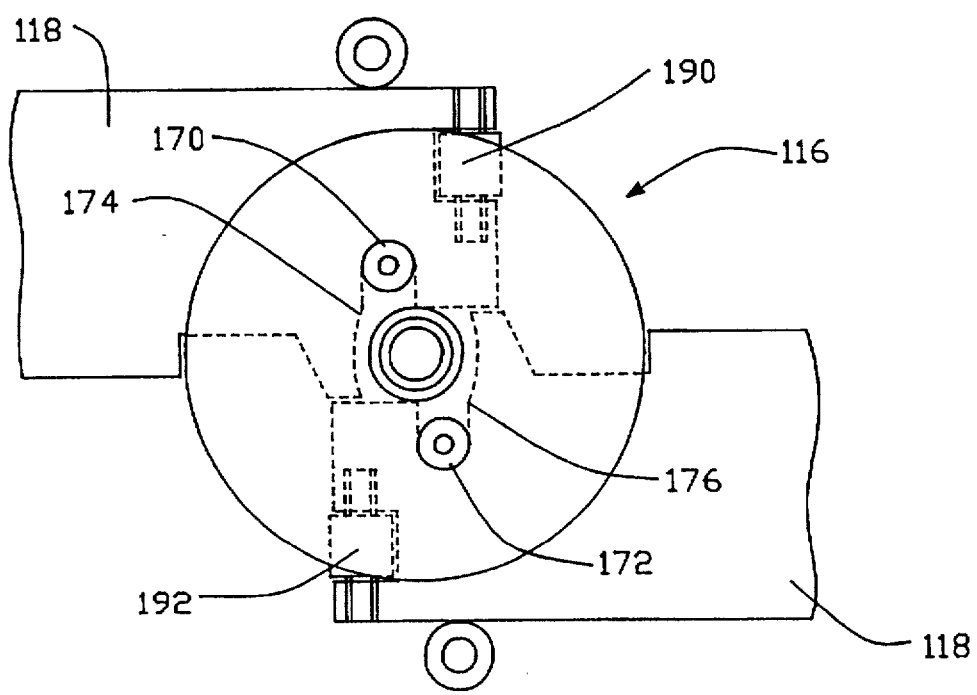

The details of the construction and operation of the preferred embodiment cam mechanism 116 will be described with reference to FIGS. 5, 6, 10–13. FIG. 10 can be correlated with FIG. 8A. FIG. 11 can be correlated with FIG. 9A.

Figure 13:
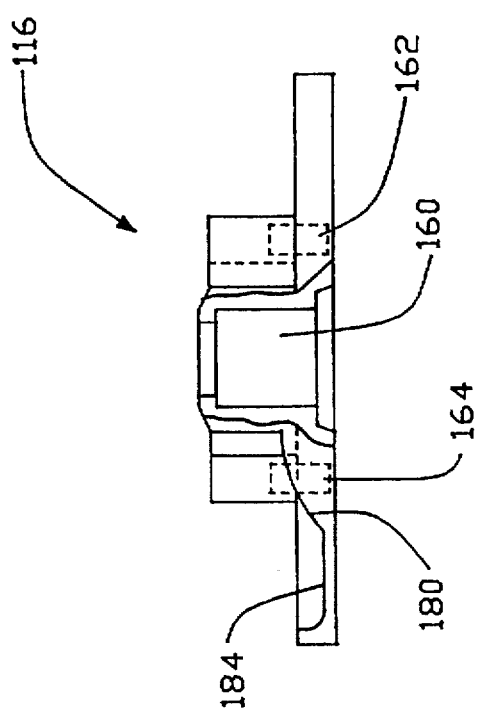
FIG. 13 is a side view of the two-stage rotary cam.
Figure 12:
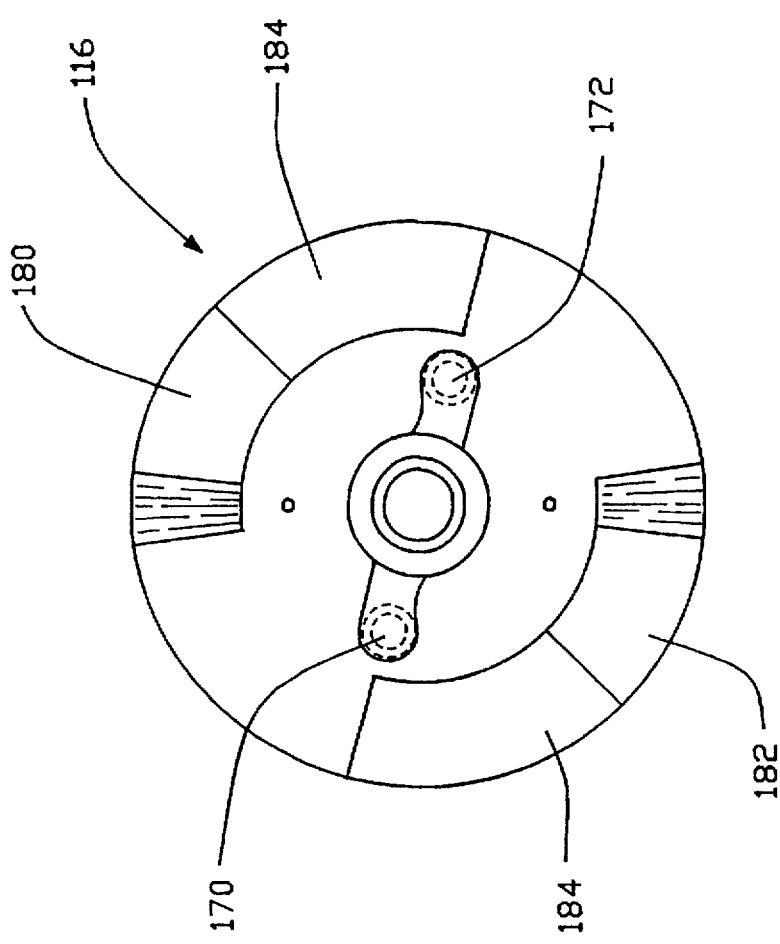
FIG. 12 is a plan view of the two-stage rotary cam.

Cam mechanism 116 is a two-stage cam mounted on a pivot post 160 (FIGS. 5, 6 and 13). Pivot post 160 is attached to box door 32. First and second holes 162 and 164 (FIG. 13) in cam mechanism 116 engage pins 82 and 83 of actuating mechanism 80 (FIG. 3).

The two stages of operation of cam mechanism 116 and latch plates 118 occur as follows. In the first stage of the latching operation, cam lobes 170 and 172 engage surfaces 174 and 176 (FIGS. 10–11), respectively of latch plates 118. As cam mechanism 116 rotates through an angle of approximately 40° from an unlatched to an intermediate position, cam lobes 170 and 172 cause latch plates 116 to move from the retracted to the extended position. In order to maintain latch plates 116 in a plane parallel to the plane of box door 32 during the sliding operation of the first stage of the latching operation, latch springs (not shown) can be attached to latch plates 116. When latch plates 118 are in the extended position, valve 112 is in the closed position such that aperture 110 is closed.

Risers 180 and 182 (FIGS. 5, 6, 12 and 13) are provided on roller surface 184 of cam mechanism 116. As cam mechanism 116 rotates beyond the first 40° of motion from the intermediate position to a latched position, linear motion of latch plates 118 ceases and rollers 190 and 192 begin riding up respective ones of risers 180 and 182. As rollers 190 and 192 ride up risers 180 and 182, latch plates 118 pivot about an axis defined by the contact points of latch plates 118 and latch plate supports $135_{1-6}$. The pivoting motion of latch plates 118 causes latch fingers $142_{1-2}$, $144_{1-2}$, $146_{1-2}$, and $148_{1-2}$ to move substantially vertically without scraping against fingers latch surfaces $150_{1-8}$. Experimental results have shown that latch fingers $142_{1-2}$, $144_{1-2}$, $146_{1-2}$ and $148_{1-2}$ undergo horizontal motion of only approximately 0.001". This minimal amount of horizontal motion minimizes the generation of particles by scraping.

In the unlatching, operation rollers 190 and 192 ride back down risers 180 and 182 as cam mechanism 116 is rotated in the opposite direction. Springs (not shown) provide the biasing force to keep rollers 190 and 192 in contact with risers 180 and 182. After rollers 190 and 192 come in contact with roller surface 184, cam lobes 170 and 172 engage cam surfaces 174 and 176 of latch plates 118 and move latch plates 118 from the extended position to the retracted position (FIG. 10). Rollers can also be replaced with a slide mechanism, plastic bump or some other serf lubricated material.

When latch plates 118 and cam mechanism 116 are in the latched position (FIG. 11), cam lobes 170 and 172 are aligned with the axis of rotation of cam mechanism 116. Accordingly, any force tending to move latch plates 118 from the extended to the retracted position is transmitted along cam lobes 170 and 172 through the rotational axis of cam mechanism 116 without creating any torque which would rotate cam mechanism 116 from the latched position. Thus, cam lobes 170 and 172 physically maintain latch plates 118 in the extended position both during the second stage of the latching operation and when the latch mechanism is in the latched orientation, preventing the latch from releasing under the application of linear impacts.

The second stage of the latching operation provides a strong clamping force to retain box door 32 in a sealing position with respect to box 20. This seal allows interior region 21 to be evacuated and back-filled with an inert gas. The clamping force is approximately one (1) pound per linear inch. This clamping force is regulated by a slight bowing or spring action of latch plates 118. This bowing is designed into latch plates 118 which are formed of 0.125-inch thick aluminum alloy, for example, 7075-T6. Although the clamping force is useful to maintain a strong seal, the breather assembly will still function in an alternate embodiment where the latch plates move horizontally but not vertically.

In order to prevent localized bending or deflection of box door 32, due to the application of the clamping force, the clamping loads are distributed. One aspect to the distribution of the clamping force is the use of multiple latch arms for each latch plate. Latch arms 142, 144, 146 and 148 are positioned at points which are half the distance from the center to the end of the edge of the box door. For a box door having a width W, latch arms are a distance approximately W/2 from each other and a distance approximately W/4 from the edge of the box door.

To strengthen the latch engaging areas of box 20, which can be formed of plastic, posts 200 are provided between each pair of latch engaging surfaces $150_{1-8}$ (FIGS. 14–15). To accommodate posts 200, each latch arm 142, 144, 146 and 148 has latch fingers $142_{1-2}$, $144_{1-2}$, $146_{1-2}$ and $148_{1-8}$ separated by a notch. Posts 200 serve to decrease the unsupported length of latch engaging surfaces $150_{1-8}$ by a factor of approximately one third and to increase the shear area by a factor of 2.

The entire latch mechanism and breather assembly is contained in box door 32 which facilitates cleaning of box 20. Tampering with latch mechanism 80 is virtually eliminated due to the fact that outside forces intended to move latch plates 118 from the extended to the retracted position do not rotate cam mechanism 116, and cam mechanism 116 is contained within cavity 154 of box door 32. Unauthorized access would require rotating cam mechanism 116 by inserting an implement into cam holes 162 and 164. Accordingly, access can be limited by the use of an interlock system which must be activated, and/or mechanical keys which must be inserted before rotation of cam mechanism 116 is possible.

Further information about the cam and latch mechanisms can be found in U.S. Pat. No. 4,995,430, which is incorporated by reference. The use of the breather assembly is not limited to use in conjunction with the disclosed latch. One skilled in the art could use the breather assembly with various other actuating devices. For example, the breather assembly could be used with another type of latch or another type of locking device. The breather assembly could be actuated directly by pins 82, a vacuum port on the port door or by a magnetic actuator (e.g. using Hall effect) on the port.

The foregoing description of a preferred embodiment of the invention has been presented for purposes of illustration and description. It is not intended to be exhaustive or to limit the invention to the precise form disclosed, and obviously many modifications and variations are possible in light of the above teaching. The preferred embodiment was chosen and described in order to best explain the principles of the invention and its practical application to thereby enable others skilled in the art to best utilize the invention in various embodiments and with various modifications as are suited to particular use contemplated. It is intended that the scope of the invention be defined by the claims appended hereto.

What is claimed is:

1. A sealable, transportable container capable of docking with a port, the port having a port sealing surface, the container comprising:

a box having a first sealing surface, a second sealing surface and an interior region, said first sealing surface capable of forming a first seal with said port sealing surface, said box adapted to store semiconductor wafers;

a box door having a third sealing surface adapted to form a second seal with said second sealing surface when said box door is moved to a sealing position with respect to said box;

a latch having a locked position and an unlocked position, said latch adapted to hold said box door in said sealing position with respect to said box when said latch is in said locked position; and a breather assembly actuated by said latch so that said breather assembly allows gas to flow between said interior region and an environment external to said container when said latch is in said unlocked position.

2. A sealable, transportable container according to claim 1, wherein said breather assembly does not allow gas to flow between said interior region and said external environment when said latch is in said locked position.

3. A sealable, transportable container according to claim 2, wherein:

said breather assembly cannot be actuated by air pressure.

4. A sealable, transportable container according to claim 1, wherein said breather assembly is housed in said box door.

5. A sealable, transportable container according to claim 1, wherein said breather assembly includes:

a filter for preventing contaminants from entering said interior region; and a valve which moves between open and closed positions.

6. A sealable, transportable container according to claim 5, wherein said latch actuates said valve so that unlocking said latch opens said valve.

7. A sealable, transportable container according to claim 1, wherein said box door has an aperture allowing gas to flow between said interior region and said environment exterior to said container;

said breather assembly includes a valve for opening and closing said aperture; and said latch actuates said valve so that said valve opens said aperture when said latch is in said unlocked position and said valve closes said aperture when said latch is in said locked position.

8. A sealable, transportable container according to claim 1, wherein:
said latch includes a plate movable between first and second positions and adapted to engage said box when in said first position;
said breather assembly includes a valve having open and close positions; and
said valve is actuated by said movable plate so that moving said plate to said second position applies a force to said valve so that said valve moves to said open position.

9. A sealable, transportable container according to claim 1, wherein:
said breather assembly is housed completely within said box door.

10. A sealable, transportable container according to claim 1, wherein:
said breather assembly cannot be actuated by air pressure.

11. A sealable, transportable container according to claim 1, wherein:
said breather assembly includes a rigid valve movable between open and closed positions such that gas can flow through said breather assembly when said valve is in said open position and gas cannot flow through said breather assembly when said valve is in said closed position.

12. A sealable, transportable container according to claim 1, wherein:
said breather assembly can be actuated by said latch without removing said box door from said sealing position with respect to said box.

13. A sealable, transportable container according to claim 1, wherein:
said latch includes a fastening device, said breather assembly being actuated by said fastening device.

14. A sealable, transportable container according to claim 1, wherein:
said breather assembly being actuated when said latch is moved from said locked position to said unlocked position.

15. A sealable, transportable container according to claim 1, wherein:
said box adapted to store a cassette, said cassette is capable of holding said semiconductor wafers.

16. A sealable, transportable container according to claim 1, wherein:
said first sealing surface being circumjacent about said second sealing surface.

17. A sealable, transportable container, comprising:
a box having a first sealing surface and an interior region, said box adapted to store semiconductor wafers;
a box door having a second sealing surface adapted to form a seal with said first sealing surface when said box door is moved to a sealing position with respect to said box;
a fastening device having a locked position and an unlocked position, said fastening device holds said box door in said sealing position with respect to said box when said fastening device is in said locked position;
breather means, actuated by said fastening device, for equalizing a pressure in said interior region with a pressure in an environment external to said container while said box door is in said sealing position with respect to said box.

18. A sealable, transportable container according to claim 17, wherein:
said breather means includes a path, through said box door, for gas to travel between said interior region and said external environment; and
said breather means opens said path when said latch is in said unlocked position.

19. A sealable, transportable container according to claim 17, wherein
said latch includes a plate movable between locked and unlocked positions and adapted to engage said box when in said locked position; and
said breather means includes a valve for opening and closing said breather means, said valve actuated by said movable plate so that moving said plate to said unlocked position applies a force to said valve so that said valve opens said breather means.

20. A sealable, transportable container according to claim 17, wherein:
said box adapted to store a cassette, said cassette being capable of holding one or more of said semiconductor wafers.

21. A door for a sealable, transportable container, comprising:
a first surface capable of supporting one or more semiconductor wafers;
a second surface;
a passageway from said first surface to said second surface;
a fastening device for retaining said door in a closed position with respect to said container; and
a valve, actuated by said fastening device between open and closed positions, for opening said passageway when in said open position and closing said passageway when in said closed position, said valve not allowing air to flow between said first surface and said second surface when in said closed position.

22. A door according to claim 21, wherein:
said latch includes a plate movable between locked and unlocked positions and adapted to engage said box when in said locked position; and
said valve actuated by said plate so that moving said plate to said unlocked position applies a force to said valve so that said valve opens said passageway.

23. A door according to claim 21, wherein said door is adapted to mate with a port door of a Standard Mechanical Interface (SMIF) system.

24. A door according to claim 21, wherein:
said valve is rigid.

25. A door according to claim 21, wherein:
said first surface adapted to support a cassette, said cassette being capable of holding said one or more semiconductor wafers.

26. A sealable, transportable container for use in a Standard Mechanical Interface system, said container comprising:
a box having a first sealing surface and an interior region;
a box door having a second sealing surface adapted to form a seal with said first sealing surface when said box door is moved to a sealing position with respect to said box, said box door having an aperture;

a latch having a locked position and an unlocked position so that said box door is retained in said sealing position when said latch is in said locked position, said latch includes a plate movable between said locked and unlocked positions so that said plate is in contact with said box when said plate is in said locked position; and a valve, adapted to open and close said aperture, said plate applies a force to said valve causing said valve to open said aperture when said plate is in said unlocked position.

27. A sealable, transportable container according to claim 26, further including a spring adapted to hold said valve in said closed position when said plate does not apply a force to said valve.

28. A system for maintaining the cleanliness of an article to be processed, comprising:

a container comprising:
  a box having a first sealing surface, a second sealing surface and an interior region;
  a box door having a third sealing surface so that said first sealing surface and said third sealing surface form a first seal when said box door is moved to a sealing position with respect to said box,
  a latch having a locked position and an unlocked position so that said box door is retained in said sealing position with respect to said box when said latch is in said locked position and said box door can be removed from said sealing position when said latch is in said unlocked position, and
  a breather assembly, actuated by said latch, said breather assembly having open and closed positions so that said breather assembly is closed and said interior region is isolated from an environment external to said container when said box door is in said sealing position and said latch is in said locked position, and said breather is open and gas can flow between said interior region and said environment external to said container when said latch is in said unlocked position; and a port comprising:
  a port plate having a fourth sealing surface and a fifth sealing surface, said fourth sealing surface and said second sealing surface forming a second seal when said box is moved to a sealing position with respect to said port plate, and
  a port door having a sixth sealing surface so that said fifth sealing surface and said sixth sealing surface form a third seal when said port door is moved to a sealing position with respect to said port plate.

29. A system according to claim 28, wherein said port further includes an actuating mechanism adapted to lock and unlock said latch.

30. A system according to claim 28, wherein said box door has an aperture allowing gas to flow between said interior region and said environment external to said container; and said breather assembly includes a valve for opening and closing said aperture, said valve actuated by said latch so that said valve closes said aperture when said latch is in said locked position and said valve opens said aperture when said latch is in said unlocked position.

31. A system according to claim 30, wherein said breather assembly further includes a filter for filtering air passing through said aperture.

32. A system according to claim 28, wherein said latch includes
  a movable plate, having locked and unlocked positions, for engaging said box, and
  a cam for moving said movable plate;

said breather assembly includes a valve for opening and closing said breather assembly, said valve actuated by said movable plate so that moving said plate to said unlocked position applies a force to said valve so that said valve opens said breather assembly; and said port includes means for actuating said cam.

33. A sealable, transportable container capable of docking with a port, the port having a port sealing surface, the container comprising:

a box having a first sealing surface, a second sealing surface and an interior region, said first sealing surface capable of forming a first seal with said port sealing surface;

a box door having a third sealing surface adapted to form a second seal with said second sealing surface when said box door is moved to a sealing position with respect to said box, said box adapted to store one or more articles such that said one or more articles reside on top of said box door when said box door is in said sealing position with respect to said box;

a latch having a locked position and an unlocked position, said latch adapted to hold said box door in said sealing position with respect to said box when said latch is in said locked position; and a breather assembly actuated by said latch so that said breather assembly allows gas to flow between said interior region and an environment external to said container when said latch is in said unlocked position.

34. A sealable, transportable container, comprising:

a box having a first sealing surface and an interior region;

a box door having a second sealing surface adapted to form a seal with said first sealing surface when said box door is moved to a sealing position with respect to said box, said box adapted to store one or more articles such that said one or more articles reside on top of said box door when said box door is in said sealing position with respect to said box;

a fastening device having a locked position and an unlocked position, said fastening device holds said box door in said sealing position with respect to said box when said fastening device is in said locked position;

breather means, actuated by said fastening device, for equalizing a pressure in said interior region with a pressure in an environment external to said container while said box door is in said sealing position with respect to said box.

* * * * *

UNITED STATES PATENT AND TRADEMARK OFFICE
CERTIFICATE OF CORRECTION

PATENT NO. : 5,740,845
DATED : April 21, 1998
INVENTOR(S) : Bonora, et al.

It is certified that error appears in the above-identified patent and that said Letters Patent is hereby corrected as shown below:

Insert on the Cover Page, Item [73]:
"[73] Assignee: Asyst Technologies, Inc., Milpitas, California"

Signed and Sealed this

Fifth Day of September, 2000

Attest:

Q. TODD DICKINSON

*Attesting Officer*  *Director of Patents and Trademarks*